United States Patent
Kondo et al.

(10) Patent No.: US 10,253,431 B2
(45) Date of Patent: Apr. 9, 2019

(54) SILICON CARBIDE SINGLE CRYSTAL AND METHOD FOR PRODUCING SILICON CARBIDE SINGLE CRYSTAL

(71) Applicant: DENSO CORPORATION, Kariya, Aichi-pref. (JP)

(72) Inventors: Hiroyuki Kondo, Kariya (JP); Shoichi Onda, Toyokawa (JP); Yasuo Kitou, Okazaki (JP); Hiroki Watanabe, Tokai (JP)

(73) Assignee: DENSO CORPORATION, Kariya (JP)

( * ) Notice: Subject to any disclaimer, the term of this patent is extended or adjusted under 35 U.S.C. 154(b) by 493 days.

(21) Appl. No.: 14/764,243

(22) PCT Filed: Jan. 13, 2014

(86) PCT No.: PCT/JP2014/000100
§ 371 (c)(1),
(2) Date: Jul. 29, 2015

(87) PCT Pub. No.: WO2014/129103
PCT Pub. Date: Aug. 28, 2014

(65) Prior Publication Data
US 2015/0361586 A1    Dec. 17, 2015

(30) Foreign Application Priority Data

Feb. 20, 2013 (JP) .................................. 2013-31239

(51) Int. Cl.
*C30B 29/36*     (2006.01)
*C30B 23/00*     (2006.01)
(Continued)

(52) U.S. Cl.
CPC ............ *C30B 29/36* (2013.01); *C01B 32/956* (2017.08); *C30B 23/00* (2013.01); *C30B 23/025* (2013.01)

(58) Field of Classification Search
None
See application file for complete search history.

(56) References Cited

U.S. PATENT DOCUMENTS

| | | | |
|---|---|---|---|
| 2002/0023581 | A1 | 2/2002 | Vodakov et al. |
| 2002/0038627 | A1 | 4/2002 | Vodakov et al. |

(Continued)

FOREIGN PATENT DOCUMENTS

| | | |
|---|---|---|
| DE | 10247017 A1 | 8/2003 |
| JP | 2005-179155 A | 7/2005 |

(Continued)

OTHER PUBLICATIONS

Sudarshan et al.; Effect of Threading Screw and Edge Dislocations on Transport Properties of 4H—SiC Homoepitaxial Layers; Journal of Applied Physics; 108, 013708; 2010.*

(Continued)

*Primary Examiner* — Guinever S Gregorio
(74) *Attorney, Agent, or Firm* — POSZ LAW GROUP, PLC

(57) ABSTRACT

A silicon carbide single crystal includes a spiral dislocation. The spiral dislocation includes a L dislocation having a burgers vector defined as b, which satisfies an equation of b><0001>+1/3<11-20>. The L dislocation has a density equal to or lower than 300 dislocations/cm$^2$, preferably, 100 dislocations/cm$^2$, since the L dislocation has large distortion and causes generation of leakage current. Thus, the silicon carbide single crystal with high quality is suitable for a device production which can suppress the leakage current.

5 Claims, 4 Drawing Sheets

(51) Int. Cl.
   *C30B 23/02*   (2006.01)
   *C01B 32/956*  (2017.01)

(56) References Cited

U.S. PATENT DOCUMENTS

| | | |
|---|---|---|
| 2002/0049129 A1 | 4/2002 | Vodakov et al. |
| 2003/0070611 A1 | 4/2003 | Nakamura et al. |
| 2005/0211156 A1* | 9/2005 | Gunjishima ............ C30B 23/00 117/2 |
| 2006/0073707 A1 | 4/2006 | Powell et al. |
| 2006/0075958 A1 | 4/2006 | Powell et al. |
| 2010/0200866 A1* | 8/2010 | Kitou ..................... C30B 25/20 257/77 |
| 2011/0006309 A1* | 1/2011 | Momose ............... C23C 16/325 257/77 |
| 2012/0073495 A1 | 3/2012 | Urakami et al. |
| 2012/0294790 A1 | 11/2012 | Sasaki et al. |
| 2013/0009170 A1 | 1/2013 | Momose et al. |
| 2014/0175461 A1* | 6/2014 | Momose ................ C30B 25/20 257/77 |
| 2014/0291700 A1 | 10/2014 | Gunjishima et al. |
| 2014/0363607 A1 | 12/2014 | Sato et al. |

FOREIGN PATENT DOCUMENTS

| | | |
|---|---|---|
| JP | 2006-66722 A | 3/2006 |
| JP | 2008-115034 A | 5/2008 |
| JP | 2011-251868 A | 12/2011 |
| JP | 2014-2104 A | 1/2014 |

OTHER PUBLICATIONS

International Search Report of the International Searching Authority dated Apr. 8, 2014 issued in the corresponding International application No. PCT/JP2014/000100 (and English translation).

Written Opinion of the International Searching Authority dated Apr. 8, 2014 in the corresponding International application No. PCT/JP2014/000100 (and English translation).

Office Action dated Dec. 25, 2014 in a corresponding Taiwan application No. 103102475 (and English translation).

Office Action dated Aug. 18, 2015 issued in corresponding JP patent application No. 2013-031239 (and English translation).

\* cited by examiner

— LARGE IN DISTORTION

— DISTORTION DIRECTION b1

SMALL IN DISTORTION

DISTORTION DIRECTION b2

SILICON CARBIDE SINGLE CRYSTAL AND METHOD FOR PRODUCING SILICON CARBIDE SINGLE CRYSTAL

CROSS REFERENCE TO RELATED APPLICATION

This application is a U.S. national stage of International Application No. PCT/JP2014/000100 filed on Jan. 13, 2014 and is based on Japanese Patent Application No. 2013-31239 filed on Feb. 20, 2013, the disclosures of which are incorporated herein by reference.

TECHNICAL FIELD

The present disclosure relates to a method for producing silicon carbide (hereinafter referred to as "SiC") single crystal and a method for producing the SiC single crystal.

BACKGROUND ART

Up to now, one of high-quality SiC single crystal wafer is disclosed in Patent Literature 1. In the SiC single crystal wafer disclosed in Patent Literature 1, a density of dislocation that adversely affects device characteristics is set to a specified value or lower, specifically, in wafer having a diameter of 3 inches, the dislocation density is set to 2500 $cm^{-2}$ or lower so as to be intended for device production. In the present specification, the dislocation means linear crystal defects, and a target dislocation is a spiral dislocation having a direction parallel to a c-axis.

However, the present inventors have earnestly conducted studies on the basis of experiments, as a result of which it is found that even if the density of the spiral dislocation is merely set to the specified value or lower, the SiC single crystal suitable for the device production which can suppress a leakage current, as shown in Patent Literature 1, is not obtained.

PRIOR ART LITERATURES

Patent Literature

Patent Literature 1: JP-2008-515748 A (corresponding to U.S. Pat. No. 7,314,520)

SUMMARY OF INVENTION

It is an object of the present disclosure to provide a high-quality SiC single crystal suitable for device production which can suppress a leakage current, and a method for producing the SiC single crystal.

According to a first aspect of the present disclosure, a silicon carbide single crystal includes: a spiral dislocation. The spiral dislocation includes a L dislocation having a burgers vector defined as b, which satisfies an equation of $b><0001>+1/3<11-20>$. The L dislocation has a density equal to or lower than 300 dislocations/$cm^2$.

In the SiC single crystal, the density of the L dislocations that can cause the generation of a leakage current in the spiral dislocations is set to be equal to or lower than 300/$cm^2$. This makes it possible to provide a high-quality SiC single crystal suitable for device production which can suppress the leakage current.

According to a second aspect of the present disclosure, a method for producing a silicon carbide single crystal includes: preparing a substrate made of the silicon carbide single crystal according to the first aspect and having a surface, which is in parallel to a {0001} plane or has a predetermined off angle with respect to the {0001} plane; and growing the silicon carbide single crystal on the surface of the substrate as a seed crystal.

According to a third aspect of the present disclosure, a method for producing a silicon carbide single crystal includes: preparing a substrate made of the silicon carbide single crystal according to the first aspect and having a surface, which has an off angle within 10 degrees in a <11-20> direction with respect to a {0001} plane; and growing the silicon carbide single crystal on the surface of the substrate as a seed crystal.

According to a fourth aspect of the present disclosure, a method for producing a silicon carbide single crystal includes: preparing a substrate made of the silicon carbide single crystal according to the first aspect and having a surface, which has an off angle within 10 degrees in a <11-20> direction with respect to a {0001} plane, and growing the silicon carbide single crystal on the surface of the substrate as a seed crystal, as a first step; cutting a substrate having a surface, which has an off angle within 10 degrees in the <11-20> direction with respect to the {0001} plane, from the silicon carbide single crystal grown in the first process, and growing the silicon carbide single crystal on the surface of the substrate as the seed crystal, as a second process; and repeating the first process and the second process a plurality of times.

As described above, a new SiC single crystal is further allowed to grow with the use of the SiC single crystal according to the first aspect as the SiC single crystal, as a result of which the high-quality SiC single crystal that takes over the quality of the base seed crystal can be produced.

BRIEF DESCRIPTION OF DRAWINGS

The above and other objects, features and advantages of the present disclosure will become more apparent from the following detailed description made with reference to the accompanying drawings. In the drawings.

EMBODIMENTS FOR CARRYING OUT INVENTION

First Embodiment

Figure 1:
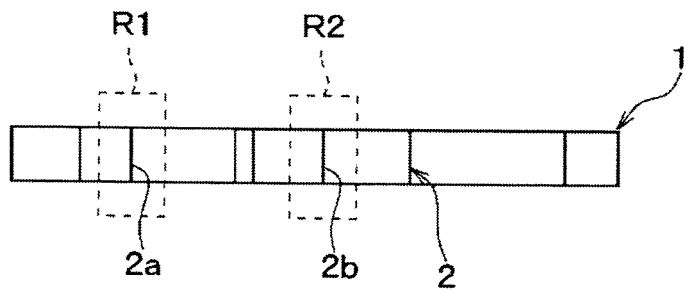
FIG. 1 is a cross-sectional schematic view of an SiC single crystal according to a first embodiment of the present disclosure.

A first embodiment of the present disclosure will be described with reference to the drawings. An SiC single crystal 1 according to this embodiment illustrated in FIG. 1 is obtained by setting an SiC single crystal ingot formed through a sublimation recrystallization method or a gas supply method in parallel to, for example, a {0001} plane, or with a predetermined off angle to the {0001} plane, and cutting out the SiC single crystal into a substrate shape. The SiC single crystal 1 cut out into the substrate shape will be exemplified. The SiC single crystal according to the present disclosure is not limited to the SiC single crystal cut out into the substrate shape, but includes an ingot shape, and also a structure in which an unnecessary portion is removed from the ingot.

The SiC single crystal 1 includes a spiral dislocation 2. In the crystal, the density of the spiral dislocation 2, that is, the number of spiral dislocation 2 existing per 1 cm$^2$ when the SiC single crystal 1 is cut in a direction perpendicular to the spiral dislocation 2 satisfies a relationship to be described later.

The present inventors have investigated a relationship between the density of the spiral dislocation 2 and a leakage current through various experiments. For example, the present inventors have provided a structure generally used in investigating whether there is the leakage current, or not, specifically, a pn diode, and investigated whether there is a leakage current, or not, when a desired voltage is applied. For example, the pn diode is configured by ion-implanting impurities into the SiC single crystal 1, and an impurity concentration is set to $1 \times 10^{21}$ cm$^{-3}$. As a result, it is confirmed that although the density of the spiral dislocation 2 and the leakage current have a correlation, the leakage current is not kept constant even if the density of the spiral dislocation 2 is equal to each other, and there are the spiral dislocations 2 intended for and not intended for the device production.

The present inventors have earnestly conducted studies, and resultantly found that there are two kinds of spiral dislocations 2, that is, the spiral dislocations 2 larger and smaller in distortion, the spiral dislocation 2 smaller in distortion hardly causes the generation of the leakage current, and the spiral dislocation 2 larger in distortion causes the generation of the leakage current.

Up to now, all of the spiral dislocations 2 are recognized as the same regardless of the magnitude of the distortion. In PTL 1, a spiral dislocation density 1c is defined. The general definition of the spiral dislocation is burgers vector b=1c=<0001>. However, there is no detailed description of a technique for measuring the burgers vector. For that reason, all of the spiral dislocations 2 are regarded as the same without taking the magnitude of the distortion into account, and the density of the spiral dislocation 2 is defined. However, according to the results found by the present inventors, when whether the SiC single crystal is intended for the device production, or not, is defined with the density of the spiral dislocation 2, it is found that there is a need to define the density of the spiral dislocation 2 taking even the magnitude of the distortion of the spiral dislocation 2 into account. In other words, even if the density of the spiral dislocation 2 is set to be equal to or lower than a specified value, uniformly regarding all of the spiral dislocations 2 as the same spiral dislocation 2 without taking the magnitude of the distortion of the spiral dislocation 2 into account, the SiC single crystal suitable for the device production which can suppress the leakage current can be obtained.

FIGS. 2A to 2C and FIGS. 3A to 3C are diagrams illustrating the spiral dislocation 2 different in the magnitude of the distortion. The spiral dislocation 2 larger in the distortion will be described with reference to FIGS. 2A to 2C, and the spiral dislocation 2 smaller in the distortion will be described with reference to FIGS. 3A to 3C. In the following description, the dislocation larger in the distortion causing the generation of the leakage current in the spiral dislocations 2 is called "leakage (L) dislocation 2a", and the dislocation smaller in the distortion hardly causing the generation of the leakage current is called "negligibly leakage (nL) dislocation 2b".

Figure 2A:
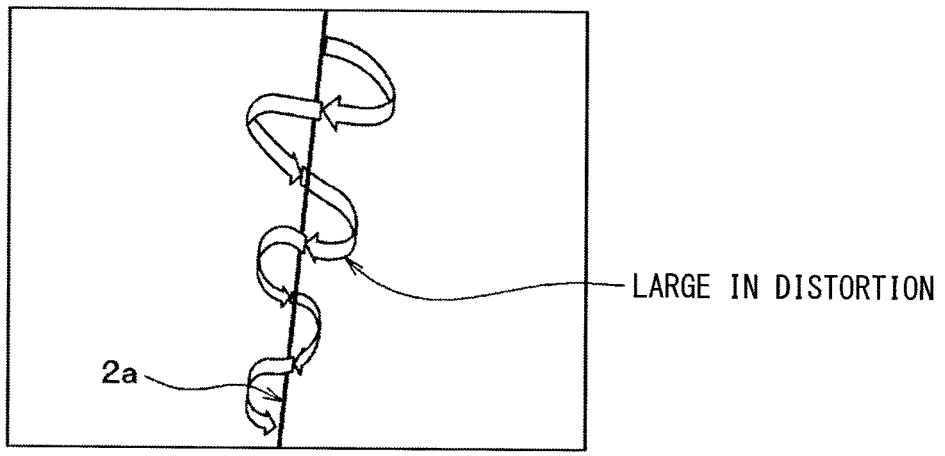
FIG. 2A is an enlarged schematic view illustrating a state of an L dislocation and a spiral distortion occurring around the L dislocation in a region R1 of FIG. 1.
Figure 3A:
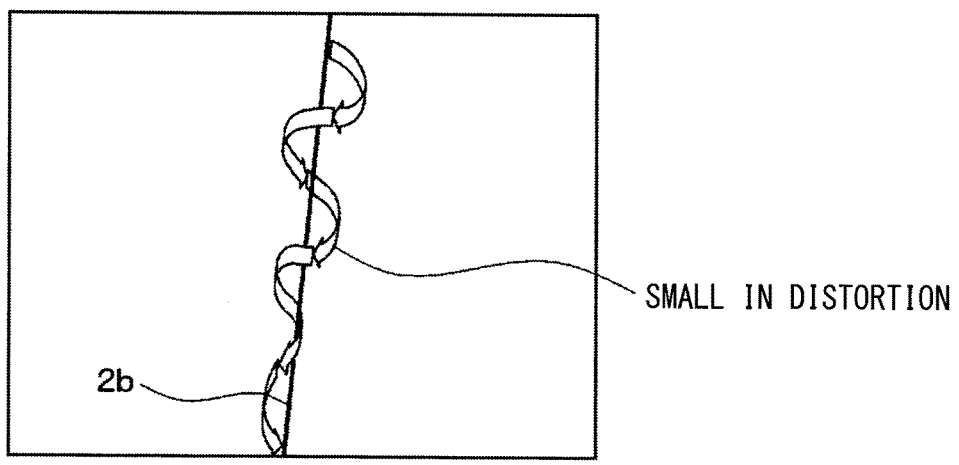
FIG. 3A is an enlarged schematic view illustrating a state of an nL dislocation and a spiral distortion occurring around the nL dislocation in a region R2 of FIG. 1.

As illustrated in FIGS. 2A and 3A, a distortion is generated spirally about a dislocation core of the spiral dislocation 2 around the spiral dislocation 2. As a result of confirmation through the experiments, the spiral distortion is larger in the L dislocation 2a illustrated in FIG. 2A, and the spiral distortion is smaller in the nL dislocation 2b illustrated in FIG. 3A as compared with the L dislocation 2a.

Figure 2B:
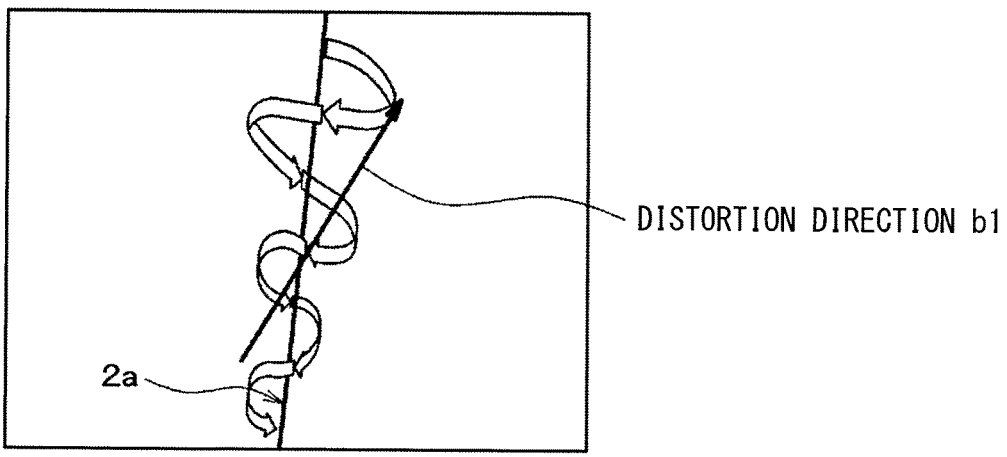
FIG. 2B is a schematic view illustrating a direction of the spiral distortion illustrated in FIG. 2A.
Figure 2C:
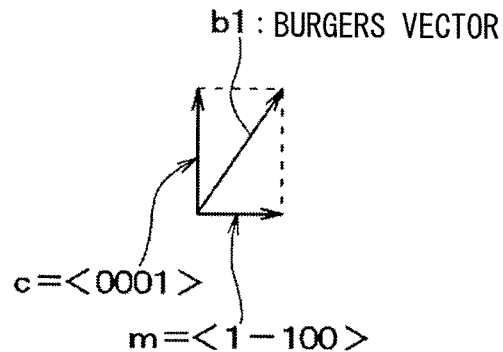
FIG. 2C is a diagram illustrating the detail of a burgers vector which is a direction of the spiral distortion illustrated in FIG. 2B.
Figure 3B:
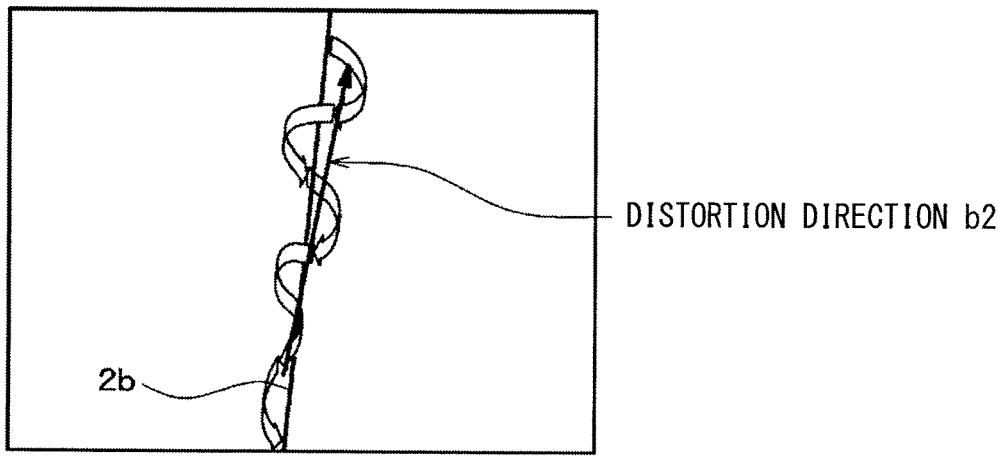
FIG. 3B is a schematic view illustrating a direction of the spiral distortion illustrated in FIG. 3A.
Figure 3C:
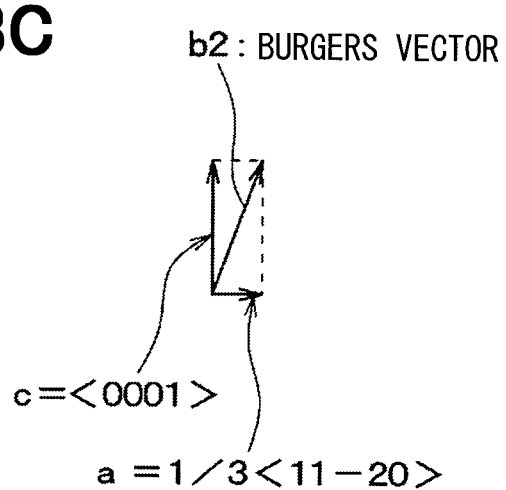
FIG. 3C is a diagram illustrating the detail of a burgers vector which is a direction of the spiral distortion illustrated in FIG. 3B.

In the L dislocation 2a and the nL dislocation 2b, the burgers vector which is a direction of the spiral distortion is represented as directions b1 and b2 indicated in FIGS. 2B and 3B. Those burgers vectors b1 and b2 can be schematically represented as illustrated in FIGS. 2C and 3C, respectively.

Figure 4:
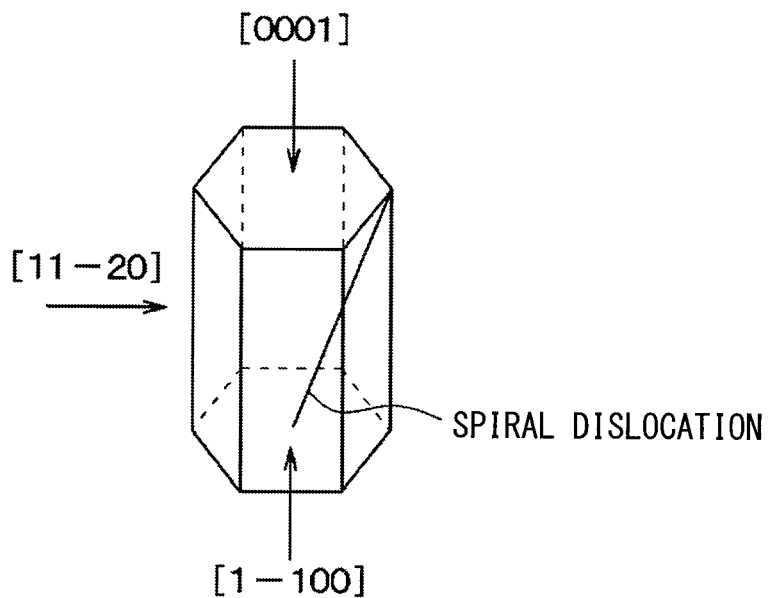
FIG. 4 is a schematic view illustrating a crystal orientation of an SiC single crystal.

Basically, the spiral dislocation 2 becomes a dislocation having a C-axis component [0001] as represented by a schematic view of a crystal orientation of the SiC single crystal 1 configured by hexagonal crystal shown in FIG. 4. As a result of conducting various studies and analyzing the SiC single crystal 1, it is confirmed that there is the spiral dislocation 2 in which a dislocation with [1-100] and a dislocation with 1/3[11-20] are present in addition to a c-axis component [0001].

Specifically, in the L dislocation 2a confirmed through the experiment, the burgers vector b1 includes a vector c in the <0001> direction and a vector m in the <1-100> direction. In the nL dislocation 2b, the burgers vector b2 includes a vector c in the <0001> direction and a vector a in the 1/3<11-20> direction.

Therefore, the spiral dislocation 2 smaller in the burgers vector b than the confirmed nL dislocation 2b can be grasped as the nL dislocation 2b that hardly causes the generation of the leakage current. In other words, when a magnitude of the burgers vector b is equal to or smaller than a magnitude of the combination of at least the vector c in the <0001> direction and the vector a in the 1/3<11-20> direction, the spiral dislocation 2 can be regarded as the nL dislocation 2b. This means that b≤<0001>+1/3<11-20> is satisfied, that is, a relationship of $b^2 \leq c^2 + 2a \cdot c + a^2$ (inner product of vector a·c=a×c×cos 90 degrees=0) is satisfied. In the magnitudes of the respective vectors, in the case of 4H—SiC, the vector c is 1.008 nm, the vector a is 0.309 nm, and the vector m is $3^{0.5} \times a = 0.535$ nm.

On the other hand, when the magnitude of the burgers vector b exceeds the magnitude of the combination of the vector c in the <0001> direction and the vector a in the 1/3<11-20> direction, the spiral dislocation 2 is likely to become the nL dislocation 2b. Therefore, the spiral dislocation 2 is grasped as the L dislocation 2a. That is, when the magnitude of the burgers vector b exceeds the magnitude of the combination of the vector c in the <0001> direction and the vector a in the 1/3<11-20> direction, the spiral dislocation 2 is grasped as the L dislocation 2a. When b><0001>+

1/3<11-20> is satisfied, that is, if a relationship of $b^2>c^2+2a\cdot c+a^2$ (inner product of vector $a\cdot c=a\times c\times \cos 90$ degrees=0) is satisfied, the spiral dislocation 2 is regarded as the L dislocation 2a.

In this way, the spiral dislocation 2 is divided into the L dislocation 2a and the nL dislocation 2b, ions are implanted into the SiC single crystal 1 to form a pn diode, and the density of the L dislocation 2a, the density of the nL dislocation 2b, and whether to generate a leakage current, or not, have been investigated through experiments. As a result, it is confirmed that whether to generate the leakage current, or not, mainly depends on the density of the L dislocation 2a, and the presence of a large amount of nL dislocation 2b hardly causes the generation of the leakage current.

Figure 5:
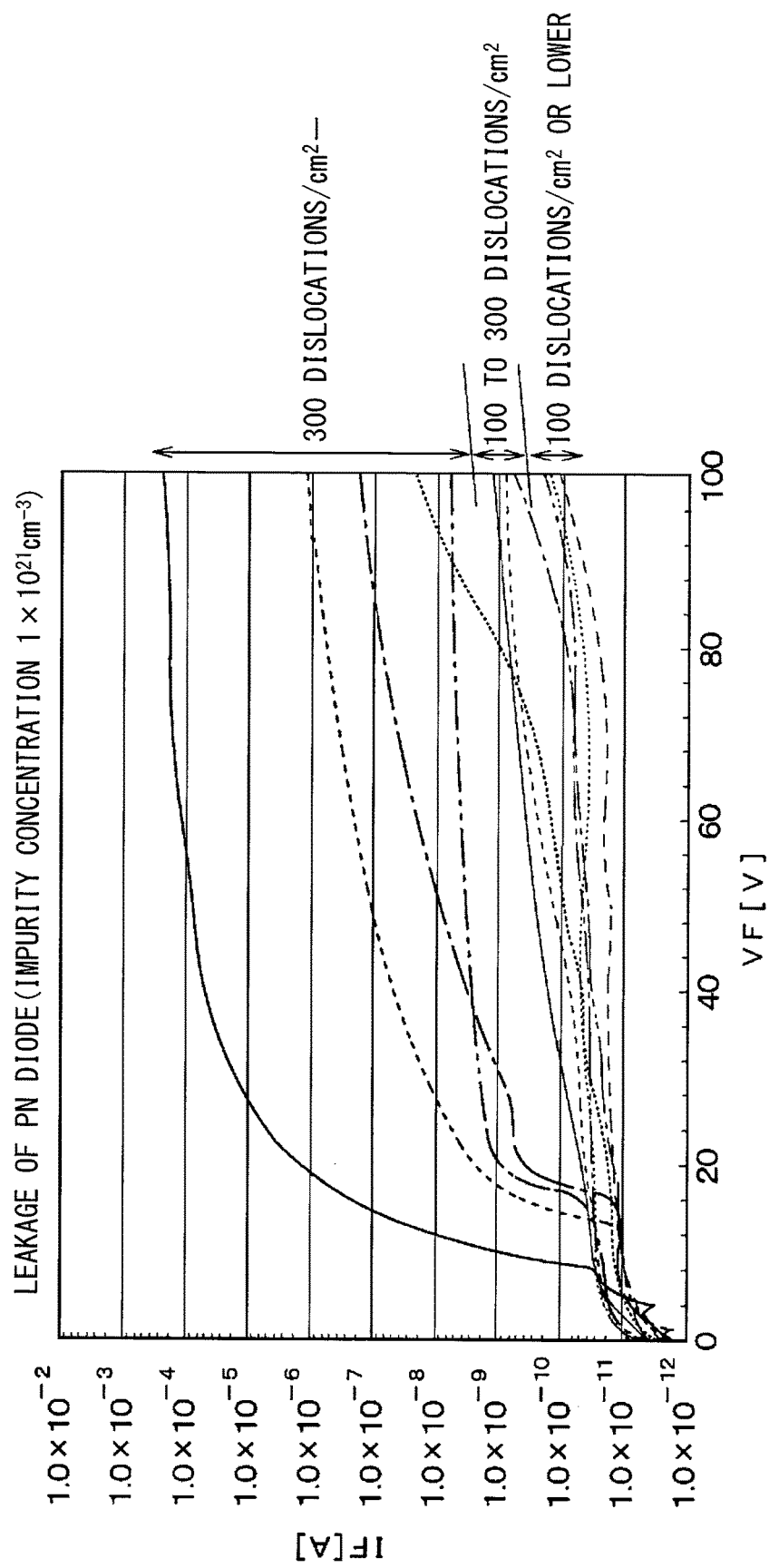
FIG. 5 is a graph illustrating the results of investigating a leakage current when a pn diode is made of an SiC single crystal.

Specifically, as illustrated in FIG. 5, when the leakage current when the diode is configured is confirmed, the leakage current is hardly generated when the density of the L dislocation 2a is equal to or lower than 100 dislocations/cm². When the density of the L dislocation 2a is equal to or lower than 300 dislocations/cm², the leakage current is slightly generated, but hardly affects the produced device. For that reason, even in that case, it can be said that the SiC single crystal 1 is intended for the device production. Conversely, when the density of the L dislocation 2a becomes about 1000 dislocations/cm², the leakage current is generated. In that case, since the device to be produced is affected by the leakage current, such an SiC single crystal 1 is not intended for the device production.

Whether the spiral dislocation 2 is the L dislocation 2a or the nL dislocation 2b can be confirmed by a large angle convergent beam electron diffraction (LACBED). Alternatively, whether the spiral dislocation 2 is the L dislocation 2a or the nL dislocation 2b can be confirmed by other methods such as transmission electron microscope (TEM) observation or X-ray topograph.

Therefore, in the SiC single crystal 1, the density of the L dislocation 2a in which the burgers vector b satisfies b><0001>+1/3<11-20> in the spiral dislocation 2 is set to be equal to or lower than 300 dislocations/cm², preferably, 100 dislocations/cm². As a result, the high-quality SiC single crystal 1 suitable for the device production which can suppress the leakage current can be provided.

The high-quality SiC single crystal 1 described above can be produced by, for example, the following methods. First, an SiC single crystal is allowed to grow on a {1-100} plane which is a growth plane of a seed crystal with the use of the seed crystal having the {1-100} plane exposed. Subsequently, a seed crystal having a {11-20} plane exposed is prepared from the SiC single crystal. Then, the SiC single crystal is allowed to growth on the {11-20} plane which is the growth plane of the seed crystal. Subsequently, a substrate-like SiC single crystal can be produced by cutting out the SiC single crystal in parallel to the {0001} plane or at a predetermined off angle to the {0001} plane. Since the SiC single crystal is produced from a so-called a-plane growth crystal, the SiC single crystal does not almost originally contain the spiral dislocation 2.

When a new SiC single crystal ingot is further allowed to grow with the high-quality SiC single crystal as a seed crystal through a sublimation recrystallization method or a gas supply method, the high-quality SiC single crystal ingot that takes over the quality of the base seed crystal can be produced. In particular, when the surface of the SiC single crystal has a predetermined off angle to the {0001} plane, the higher-quality SiC single crystal ingot can be produced while heterogeneous polymorphism is restrained from being formed due to a step flow growth. The substrate-like SiC single crystal 1 can be produced by cutting out the SiC single crystal ingot in parallel to the {0001} plane or at a predetermined off angle to the {0001} plane. The SiC single crystal 1 in which the density of the L dislocation 2a satisfies the above range is further selected from the produced SiC single crystals 1. This makes it possible to obtain the high-quality SiC single crystal 1 intended for the device production described in this embodiment.

When the predetermined off angle from the {0001} plane falls within 10 degrees in a <11-20> direction, as a result of which the burgers vector b of the L dislocation 2a of the spiral dislocation 2 present in the seed crystal is likely to be converted from <0001>+<1-100> into <0001>+1/3<11-20>. Therefore, the L dislocation 2a can be converted into the nL dislocation 2b, and is more effective. This principle is because the orientation of the spiral dislocation 2 is likely to be oriented from the <1-100> direction to the <11-20> direction due to the growth.

Further, as the growth in which the predetermined off angle from the {0001} plane falls within 10 degrees in the <11-20> direction is more repeated, the burgers vector b is likely to be converted into <0001>+1/3<11-20>, and the L dislocation 2a can be exponentially converted into the nL dislocation 2b, which is therefore further effective. Like the above, this principle is because the orientation of the spiral dislocation 2 is likely to be oriented from the <1-100> direction to the <11-20> direction due to the growth.

When the off angle is made larger than 10 degrees in the above growth, there arises such a problem that the stacking fault occurs. Therefore, the high-quality SiC single crystal intended for the device production is not obtained.

As described above, in this embodiment, the spiral dislocation 2 is divided into the L dislocation 2a and the nL dislocation 2b, and the density of the L dislocation 2a is set to be equal to or lower than 300 dislocations/cm², preferably 100 dislocations/cm². As a result, the high-quality SiC single crystal 1 suitable for the device production which can suppress the leakage current can be provided.

Other Embodiments

The present disclosure is not limited to the above embodiments, but can appropriately change within a scope of the claims.

For example, the plane orientation and the producing method of the SiC single crystal 1 described in the above embodiments are arbitrary, and at least the density of the L dislocation 2a in the SiC single crystal 1 may fall within the range described in the above embodiments. In producing the SiC single crystal ingot, a spiral dislocation generatable region in which the spiral dislocation 2 is positively generated may be partially provided, and a low density spiral dislocation region in which the density of the spiral dislocation 2 becomes smaller may be provided in the other portion. In that case, in the low density spiral dislocation region used for the device production, the density of the L dislocation 2a may fall within the range described in the above embodiments.

In the above embodiments, the pn diode is prepared as an example of the device formed for the SiC single crystal 1, and whether to generate the leakage current, or not, is investigated. The other elements such as a MOSFET have the same relationship of whether to generate the leakage current, or not, as the pn diode. Therefore, if the density of the L dislocation 2a falls within the range described in the above embodiments, the SiC single crystal 1 is intended for another device production of the diode.

In the case of indicating the vector, a desired alphabetic character should be originally bold, or a right arrow should be attached above the alphabetic character, but because the restricted expression is restricted based on electronic applications, the vector is described in front of the desired alphabet character. In the case of indicating the crystal orientation, a bar (-) should be originally attached above a desired number, but because the restricted expression is restricted based on electronic applications, the bar is attached in front of the desired number in the present specification.

The invention claimed is:

1. A silicon carbide substrate comprising:
a spiral dislocation, wherein:
the spiral dislocation includes a linear L dislocation having a Burgers vector defined as b;
a magnitude of the Burgers vector b is larger than a magnitude of a combination of a vector of <0001> and a vector of 1/3<11-20>;
the linear L dislocation has a density equal to or lower than 300 dislocations/cm$^2$; and
the linear L dislocation is a screw dislocation.

2. The silicon carbide single crystal according to claim 1, wherein:
the density of the linear L dislocation is equal to or lower than 100 dislocations/cm$^2$.

3. The silicon carbide substrate according to claim 1, wherein:
the silicon carbide substrate is made from a SiC single crystal ingot.

4. The silicon carbide substrate according to claim 3, wherein:
a leakage current attributed to the negligible leakage dislocation is smaller than the predetermined leakage dislocation.

5. The silicon carbide substrate according to claim 1, wherein:
the spiral dislocation having the linear L dislocation with the Burgers vector b is a negligible leakage dislocation which has a smaller distortion than a predetermined leakage dislocation; and
the negligible leakage dislocation is disposed in the silicon carbide substrate.

* * * * *